(12) United States Patent
Shephard, III

(10) Patent No.: US 6,553,527 B1
(45) Date of Patent: Apr. 22, 2003

(54) PROGRAMMABLE ARRAY BUILT-IN SELF TEST METHOD AND CONTROLLER WITH PROGRAMMABLE EXPECT GENERATOR

(75) Inventor: Philip George Shephard, III, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/435,875

(22) Filed: Nov. 8, 1999

(51) Int. Cl.[7] .......................... G06F 11/00; G01R 31/28
(52) U.S. Cl. .................... 714/733; 714/736; 714/725
(58) Field of Search ................... 714/733, 725, 714/736, 738, 743, 718, 719, 824, 42, 43

(56) References Cited

U.S. PATENT DOCUMENTS

| | | | |
|---|---|---|---|
| 4,835,774 A | * 5/1989 | Ooshima et al. ............ | 714/719 |
| 5,173,906 A | 12/1992 | Dreibelbis et al. ......... | 371/22.5 |
| 5,577,050 A | * 11/1996 | Bair et al. .................. | 714/710 |
| 5,633,877 A | 5/1997 | Shephard, III et al. .... | 371/22.2 |
| 5,812,469 A | 9/1998 | Nadeau-Dostie et al. ... | 365/201 |

\* cited by examiner

Primary Examiner—Christine T. Tu
(74) Attorney, Agent, or Firm—Richard F. Frankeny; Winstead Sechrest & Minick P.C.; Casimer K. Salys

(57) ABSTRACT

The present invention adds a programmable expect generator (PEG) that generates expected patterns of output for comparison to the actual outputs of an array while undergoing a complex test input sequence. The output of a programmable array built-in self test (PABIST) controller has its output increased to include separate control bits and a mask bit for a PEG. The PEG in one embodiment of the invention is substantially similar to a data control register that is programmed by a sequence of commands to generate the array input data patterns for testing an array. The program sequence that controls the PABIST and generates the input address, data and read/write patterns also outputs separate control bits to direct the PEG to generate expected outputs from the array when data from corresponding read addresses are read. The incorporation of a mask bit that accompanies each group of PEG control bits is used to inhibit the compare function that compares the output of the array to the output of the PEG. The mask bit controls when outputs of the array under test are compared to the PEG.

19 Claims, 7 Drawing Sheets

PROGRAMMABLE ARRAY BUILT-IN SELF TEST METHOD AND CONTROLLER WITH PROGRAMMABLE EXPECT GENERATOR

CROSS-REFERENCE TO RELATED APPLICATION

The present application is related to U.S. patent application Ser. No. 09/435,873, entitled "A Programmable Array Built-in Self Test Method and System for Arrays with Imbedded Logic," which is hereby incorporated by reference herein.

TECHNICAL FIELD

The present invention relates in general to data processing systems, and in particular, to Array Built-In Self Test of integrated circuits implemented in a processor incorporated in the data processing system.

BACKGROUND INFORMATION

In general, integrated circuit arrays (e.g. memory arrays) are tested by providing a known data input at a known address to the array and comparing the output to the expected output. One well know and widely used system for testing integrated circuit logic, particularly integrated circuit memory arrays, is to form a dedicated test circuit on the chip with the array itself This Array Built-In Self Test (ABIST) technology allows high speed testing of the array without having to force correspondence between the array and the input/output connections to the chip itself. In order to provide high speed testing and to confine the test system to a minimum area of the chip, early ABIST systems had hardwired circuits for generation of test data, generation of control sequences, and test data gathering. However changes in the structure and types of arrays in integrated circuit chips required special hardware for each type of array tested and for the varied expected failure conditions. Improvements in ABIST followed when the control sequences and test patterns were generated by built-in programmable ABIST (PABIST) systems. PABIST systems allowed a programmable controller with an instruction storage space to be loaded with instructions. Instructions were scanned in via a level sensitive scan device (LSSD).

A PABIST system tests an array by executing a sequence of instructions to generate test patterns for an array, testing results and scanning out the test results also using a LSSD. With a suitable instruction set, control of how the sequence was executed and incorporating methods for changing instruction sequence, a sophisticated and powerful PABIST was possible. Programmability enabled a standard test system to be integrated onto integrated circuits for testing a variety of array types and variety of failure modes. PABIST also allowed new tests to be developed and used without modifying the hardwired circuits of the integrated circuit chip.

Early programmable PABIST systems allowed a wider variety of tests to be run than was previously possible with hardwired test logic. An array test designer did not have to anticipate all types of failures and all desired test sequences. To test a specific array, PABIST controllers could be loaded with instruction sequences that when executed would write data to and read data from the array. The simplest test in this type of system would be to compare what is written to a specific address of the array with what was read from the same address of the array. In this case what was written to an address was what was "expected" when a read was executed at the corresponding same address. The input/output data was compared in a data comparator that compared all the bits. Different patterns were written to and read from the array and a pass/fail result was possible after a particular test pattern was executed.

This type of pass/fail indicator is highly desirable for diagnostics, and is essential if capturing the failed addresses is needed for repairable arrays. The failure modes for present arrays require test data patterns with more complexity both in the static bit patterns (what was written in adjacent cells) and in dynamic patterns of control sequences (what were the sequences of reads and writes) combined with patterns of data bits. PABIST allowed more complex testing but a simple input/output compare with a pass/fail was no longer always possible. What was written to an address may not be what was read at the next cycle, a different address may be read, or a read complement of the data may be executed in an attempt to exercise all of the potential failure modes of the array.

To deal with these complexities, designers implemented "signature" testing. In signature testing, test patterns and sequences of reads and writes would be simulated and, since the correct output at each read was known, a signature of the expected outputs could be generated. When the same test patterns and sequences were applied to an array, the read outputs were outputted and compared to the known "signature" to determine if the array was functioning correctly. A pass/fail on each array was not possible because the expected result on the array out was not generated in the ABIST engine.

While programmable PABIST has brought improvements, the ability to generate very complex data patterns and sequences of operations on an array has outstripped the ability of the test method and hardware to simply analyze the results because of the complexity required to determine expected outputs for compare; the potential of PABIST has been limited.

Clearly there is a need to improve the programmable ABIST system to deal with increased array complexity and the complexity of test patterns and sequences needed to test the failure modes of the arrays.

SUMMARY OF THE INVENTION

The present invention adds a programmable expect generator to a programmable Array Built-In Test (PABIST) system to generate data patterns to compare to the outputs of an array that is under test. Prior art PABIST systems sometimes do a simple write of data to an array address followed by a read of the data written. In this simple case the input data written at an address is the data "expected" when data is read from the corresponding same address. In dense VLSI arrays, failure modes depend not only on the bits adjacent to a given bit in all spacial directions but also on what operation sequences preceded or came after writing or reading a given bit. In these complex tests it is not possible to test an array with a simple write then read and compare at a given address. PABIST systems have employed a form of signature testing to handle these test cases. The present invention discloses the use of a programmable expect generator (PEG), which is, in one embodiment, a duplicate of the data control register used to generate input data patterns for a PABIST system. The PEG has separate control lines and while the PEG receives the same type of programming commands synchronous with the data control register, in general it receives a different control sequence than the data control register in the same PABIST system. In many cases the PEG can be programmed to generate the sequence of data outputs expected from an array undergoing a complex input address, data and read/write control sequence. This program for the PEG for a given test is determined beforehand along with the program for the PABIST controller generating the test sequence. The PEG also has a corresponding mask bit with each program step that controls whether a compare is enabled on each array data output sequence step. If a test sequence does not allow all of the sequential states of array outputs to be compared within a single corresponding sequence of PEG program steps, those sequences not testable are masked and a separate pass of the test sequence can be run with a different PEG program which will generate expected outputs for missed sequences. The PEG allows pass/fail testing of complex input data patterns and corresponding read/write sequences not previously possible with PABIST.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
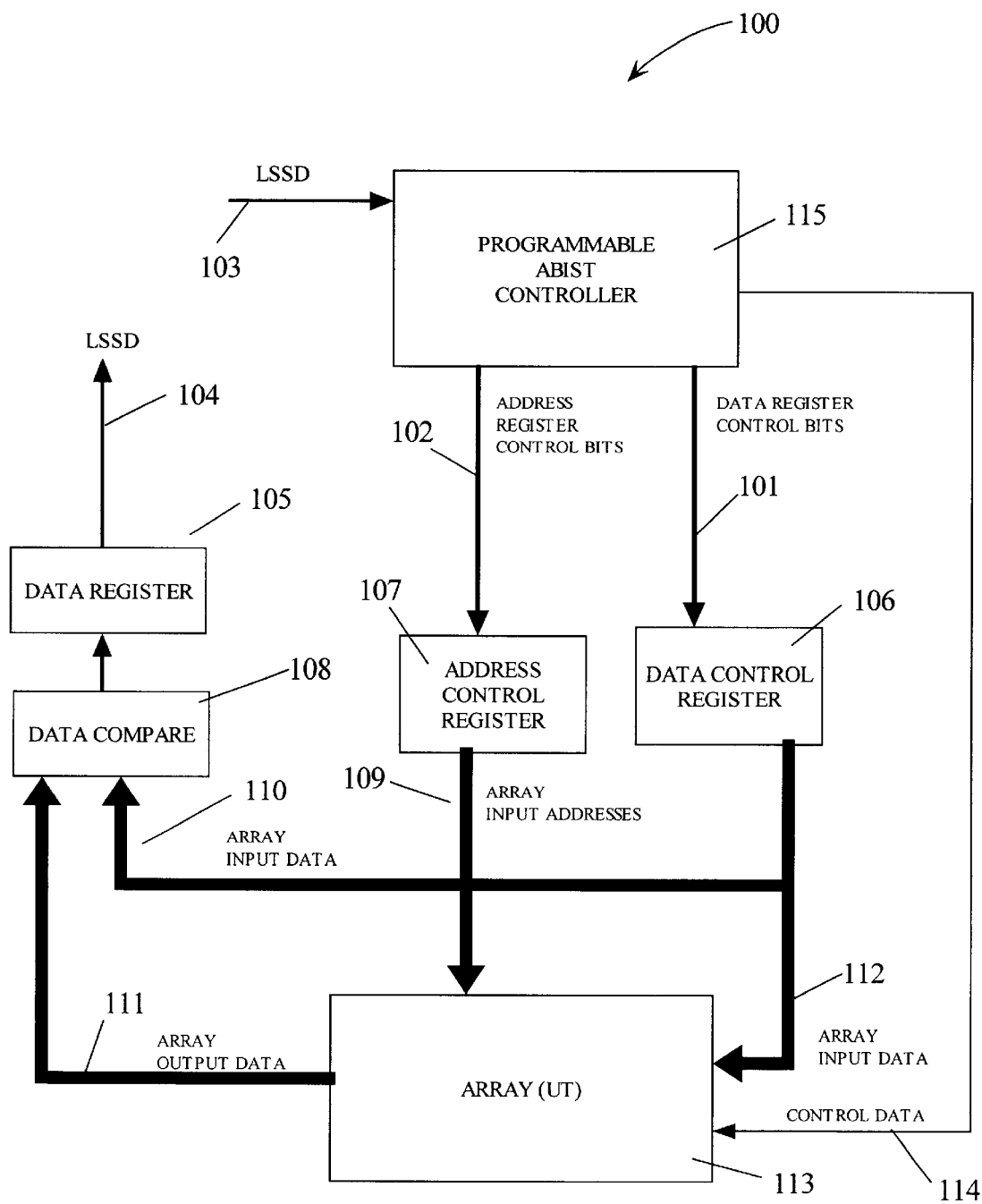
FIG. 1 is a block diagram of a prior art ABIST system using simple data compare on input/output test patterns.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 4:
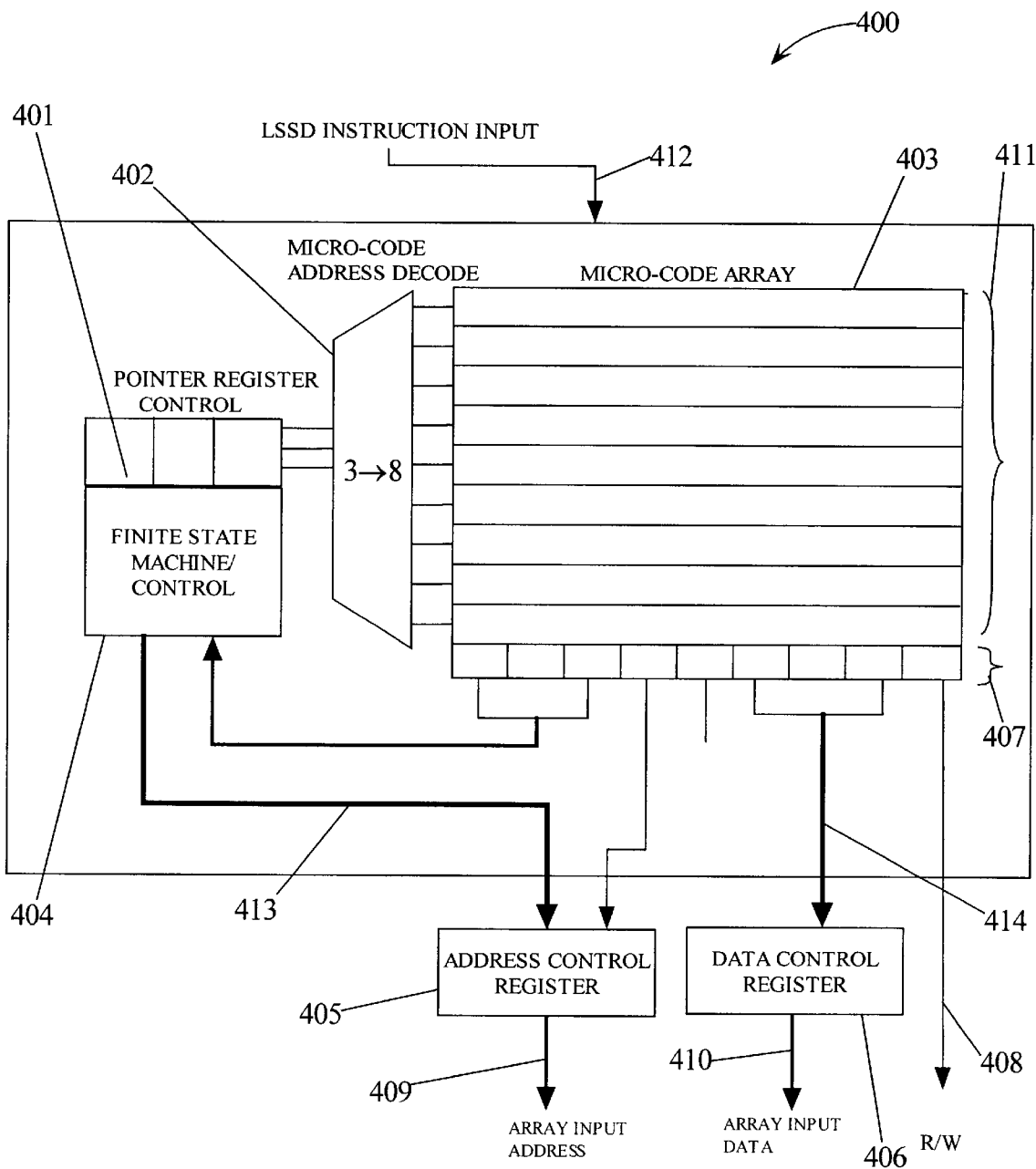
FIG. 4 is a block diagram illustrating elements of prior art PABIST controllers.

FIG. 4 is a block diagram of elements of a present state of the art programmable ABIST (PABIST) controller 400. PABIST 400 includes a micro-code array 403 that can be loaded with a sequence of instructions 411 via LSSD scan input 412. PABIST controller 400 can execute these instructions 411 using finite state machine/control 404, pointer control register 401 and micro-code address decode 402. Other execution units like branch control (not shown) may be included in the PABIST controller. The sequential outputs 407 of the micro-code array 403 are coupled to address control register 405, data control register 406, read/write control 408, and finite state machine/control 404, to generate array addresses 409 and array data 410 and read/write controls 408 that are correspondingly coupled to an array under test (AUT) 113 (see FIG. 1).

Figure 5:
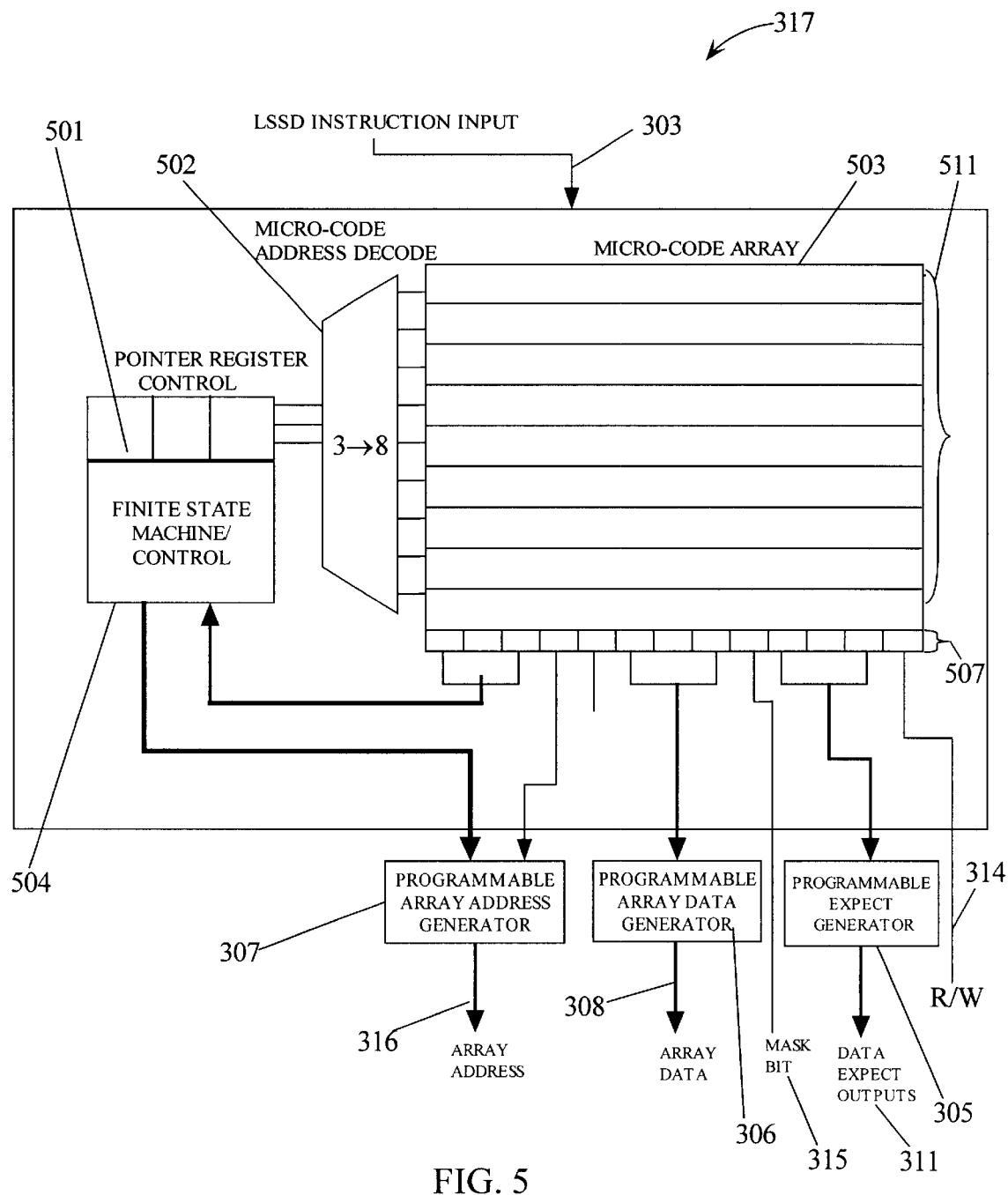
FIG. 5 is a block diagram of a PABIST controller with the addition of the PEG of the present invention.

FIG. 5 is a block diagram of elements of programmable ABIST (PABIST) controller 317 of the present invention. PABIST controller 317 includes a micro-code array 503 that can be loaded with a sequence of instructions 511 via LSSD scan input 303. PABIST controller 317 can execute these instructions 511 using finite state machine/control 504, pointer control register 501 and micro-code address decode 502. Other execution units like branch control (not shown) may be included in the PABIST controller 317. The sequential outputs 507 of the micro-code array 503 have been expanded to include control lines 301 for added programmable expect generator (PEG) 305 and mask bit 314. The outputs 507 are coupled to programmable address generator 307, programmable data generator 306, read/write control 3 18, and finite state machine/control 504, to generate array addresses 316 and array data 308 and read/write controls 318 that are correspondingly coupled to an array under test (AUT) 309 (see FIG. 3).

FIG. 1 is a block diagram illustrating an implementation of a PABIST system 100. PABIST controller 115 is a special purpose controller with a defined instruction set and state machine logic feedback similar to the one illustrated in FIG. 4. Test instructions are scanned to PABIST controller 115 via a level sensitive scan device (LSSD) 103. PABIST controller 115 couples address register control bits 102 to an address control register 107 and data register control bits 101 to a data control register 106. The control registers 107 and 106 decode bits resulting from instruction execution by PABIST controller 115. Control registers 106 and 107 with their internal logic, generate desired patterns of array input addresses 109 and array input data 112 coupled to the array under test (AUT) 113. In PABIST system 100 the array input data written into AUT 113 at an address is defined as what is expected as an output when read from the corresponding same address. If at anytime a non-compare occurs in data comparator 108 a fail is recorded in data register 105. More sophisticated versions of PABIST system 100 may also record the addresses where non-compares occur by also coupling array input addresses 109 into data register 105 which additionally incorporates logic and storage to record addresses as well as pass fail/data. Results of a test program stored in data register 105 are scanned out via LSSD 104.

PABIST system 100 allows easier generation of more sophisticated test patterns than prior fixed logic systems and also allows test patterns to be changed by loading new sequences of instructions into ABIST controller 100. However, the desire to write and do multiple reads, write data and read its complement and to execute other complex sequences of control data 114 and data patterns no longer allows the array input data 112, in certain tests, to be the expected array output data 111. For example, if a test executed a sequence of multiple writes to sequential addresses and then read from the address there may not be a correspondence between the output of the data control register and the data read from the address. Write and reads of certain modulo data patterns also may not have a correspondence of array input data and array output data at a particular step of test data generation.

Figure 2:
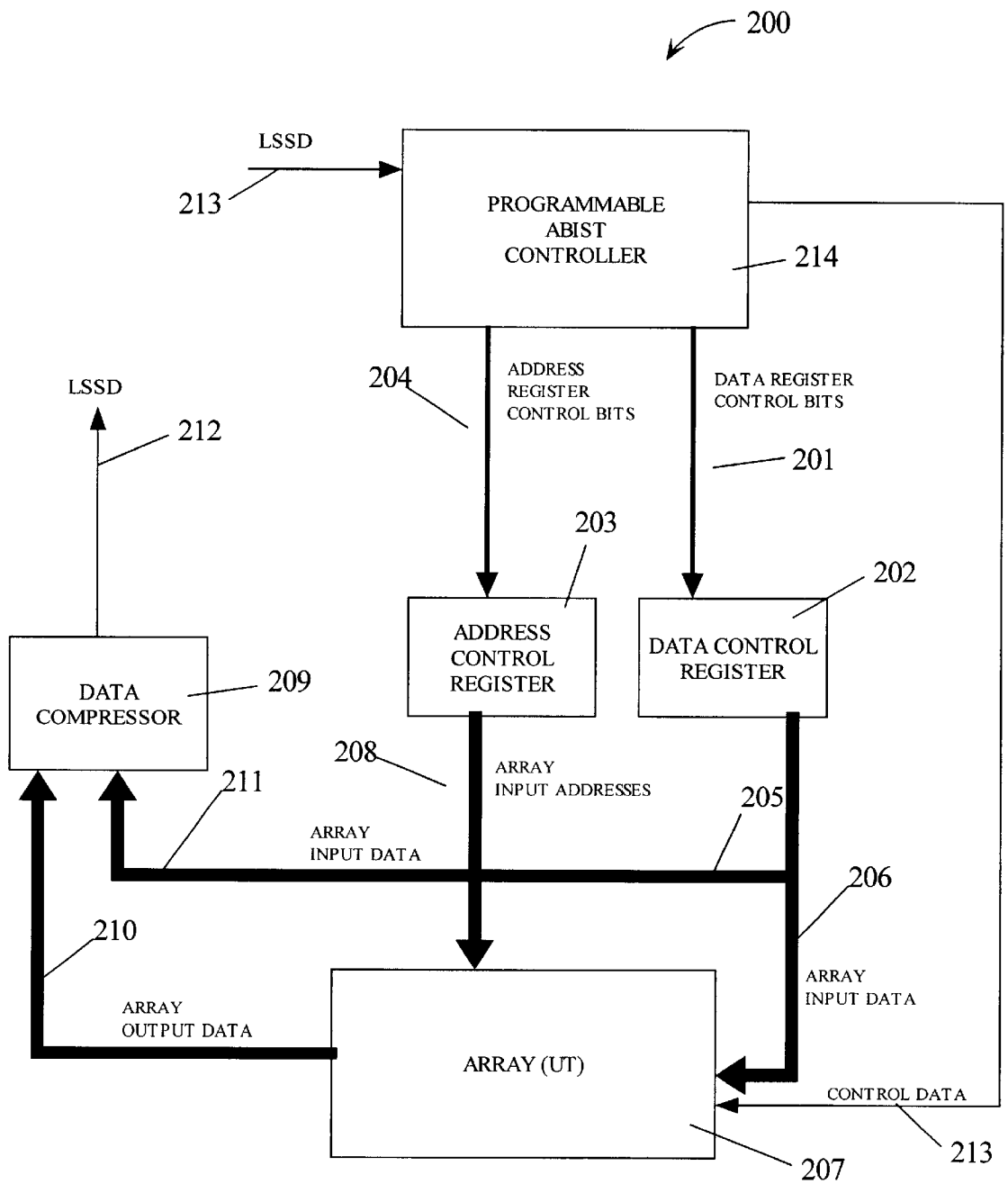
FIG. 2 is a block diagram of a prior art ABIST system using a data compressor to generate a signature of a test pattern and a sequence of writes and reads.

FIG. 2 illustrates a PABIST system 200 where the data comparator 108 illustrated in FIG. 1 is replaced with a data compressor 212, which includes circuitry that produces a signature of the sequential outputs of array 207 resulting when a particular test is run. This signature is a compressed form of the actual array output data sequence that results when an array 207 is tested.

Since it was desirable to have test patterns with more complexity and time variance, a form of "signature" testing was introduced to ABIST. The signature of a given test was determined ahead of time (for example by simulation) by generating the array output data 210 expected for a given array input data 206 pattern undergoing a sequence of corresponding read/write controls 213 to AUT 207. When a test was run, the data compressor 212 generated a signature of sequential results for the given test. The signature, determined by the data compressor 212, was scanned out via 212 after a given test and compared to the pre-determined expected signature to establish the results of a test. Signature analysis did not allow the recording of addresses of locations where an array failure was detected. Recording these "failed addresses" was important to some array testing especially for arrays with redundancy.

The PABIST system 200 of FIG. 2, while advancing the state of the art of ABIST to include time sequence testing, did not exploit the flexibility and potential of the PABIST controller.

Figure 3:
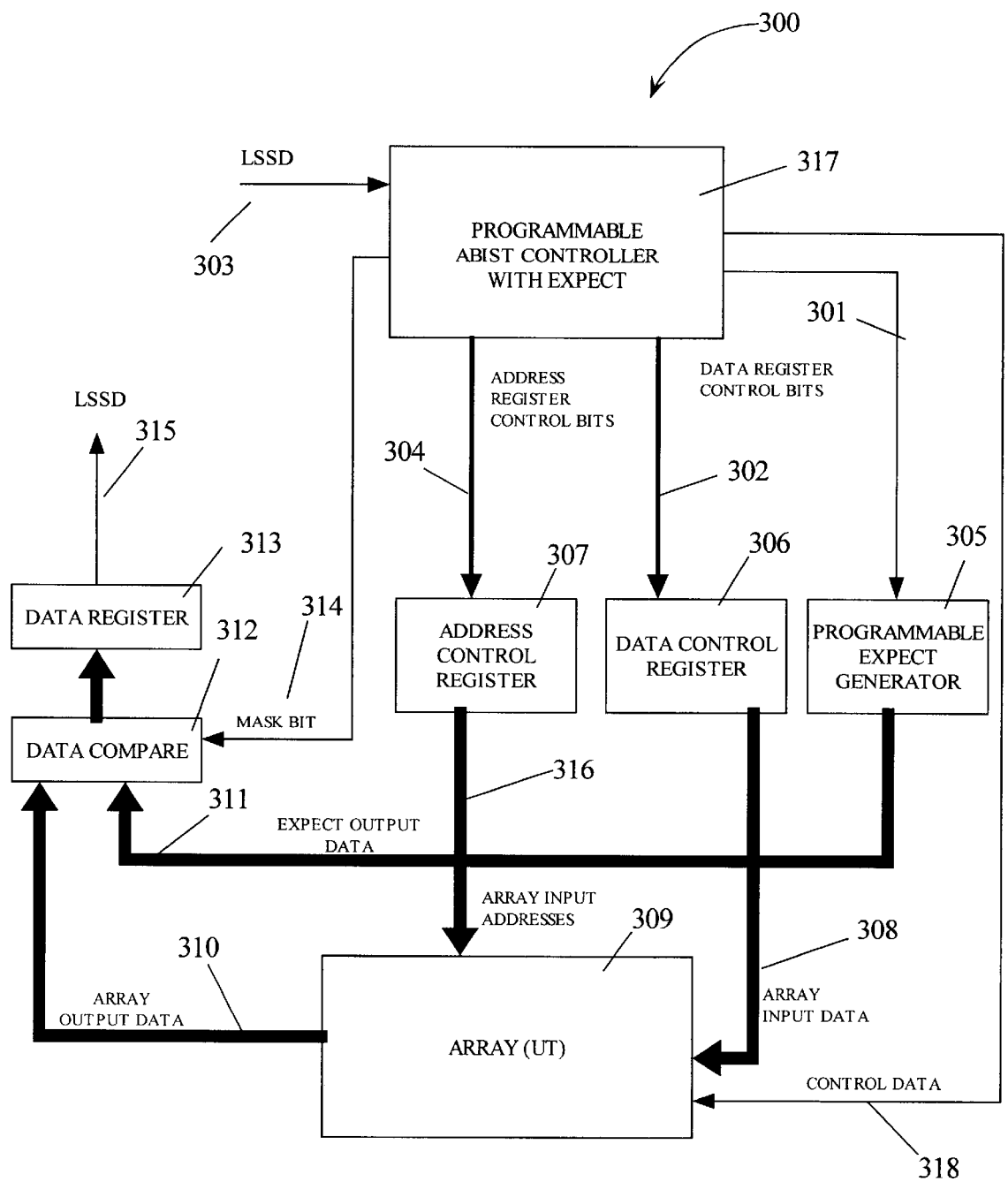
FIG. 3 is a block diagram of a PABIST system using a programmable expect generator of one embodiment of the present invention.

FIG. 3 illustrates one embodiment of the present invention which improves a PABIST system 300 with the addition of the programmable expect generator (PEG) 305. PABIST controller 317, address control register 307 and data control register 306 contain embodiments of previously disclosed PABIST systems with the ability to generate complex data patterns and control sequences to test an AUT 309. The addition of a separable PEG 305 improves the state of the art of the illustrative PABIST system 300.

The PEG 305, in one embodiment of the present invention, is a data control register like data control register 306. Other embodiments of the present invention may use other versions of a PEG which function differently from the data control register. PEG 305 includes the similar functionality as the data control register 306. Data control register 306 generates array input data patterns based on decodes of the data register control bits 302. The output of the PABIST controller 317 is expanded to include additional control bits 301 for PEG 305. A sequence of control bits 301 programs PEG 305 to also generate data patterns. Control bits 301 also include a mask bit 314 that is coupled to data compare 312 and may be used to inhibit functions of data compare 312.

When a particular sequence of instructions in PABIST controller 317 is executed, known array output data 310 should result when the address and data patterns of address control register 307 and data control register 306 write to and read from array AUT 309. With the addition of PEG 305, control bits 301 are also programmed to generate an array output data sequence from PEG 305 that emulates what an array is "expected" to present on its output when receiving the input test patterns corresponding to a given address, data, and control sequence.

In general, PEG 305 may include the ability to delay on a cycle basis its output relative to the array data output. The time required to read out data may take more cycles relative to the time it takes the PEG 305 to generate the expected output for the read. The added feature of a cycle delay or a pipeline enables the array output data and the PEG 305 to be time synchronized to enable comparison.

PABIST system 300 may not always be possible to generate address and data input test patterns, with corresponding writes and reads to an array, and at the same time generate a corresponding expected output using the disclosed PEG 305. For those cases where a single pass of a desired test cannot have the PEG 305 generate the corresponding expected output for comparison in data compare 312, the mask bit 314 is included at the proper instruction step and is used to inhibit compare on any known incorrect or non-testable outputs of PEG 305. However, another pass of the desired test sequence can then be executed and a new set of programmed instructions, via data control register bits 301, may be used to direct PEG 305 to generate expected outputs for the missed sequence steps.

With the addition of PABIST controller 317, tests may be changed by scanning in various instructions sets. The PEG 305 may be also programmed to concurrently generate an expected output sequence the same as the array output data 310 of AUT 309 receiving the outputs of address and data control registers 306 and 307 and control sequences 318. Using the PEG 305, a multiplicity of tests sequences can be executed in PABIST controller 317 and the output of the PEG 305 can be compared to the output of the AUT 309 in data comparator 312. The addition of PEG 305 allows pass/fail tests results when complex array input data patterns and variable sequences of reads and writes are used to test an array. Results of a test are stored in data register 313 and scanned out via LSSD 315.

The addition of PEG 305 allows pass/fail testing of complex sequences of data, addresses and read/write control. This fact again allows the feature of determining the addresses in the array where failure occurred. These "failed addresses" can be recorded in the data compare register by feeding the array address data into the data compare register. In cases where failed addresses are to be recorded cycle delays may have to be incorporated into the path coupling the array address data to the data compare register. The cycle delay enables synchronization of address data and compare of array output data and data expect outputs. The cycle delay may also be incorporated into the data compare register itself.

Depending on the complexity of the arrays and the test patterns to be applied to an array, the PEG 305 can also have varying degrees of complexity. A PEG 305 may be as simple as a programmable counter for some complexity of array testing. In one embodiment of the present invention the PABIST system 300 is used to test many different arrays by having array test data multiplexed to many arrays on an integrated circuit chip. Any array not under test is inhibited from participating in a given array test running on another array.

Figure 6:
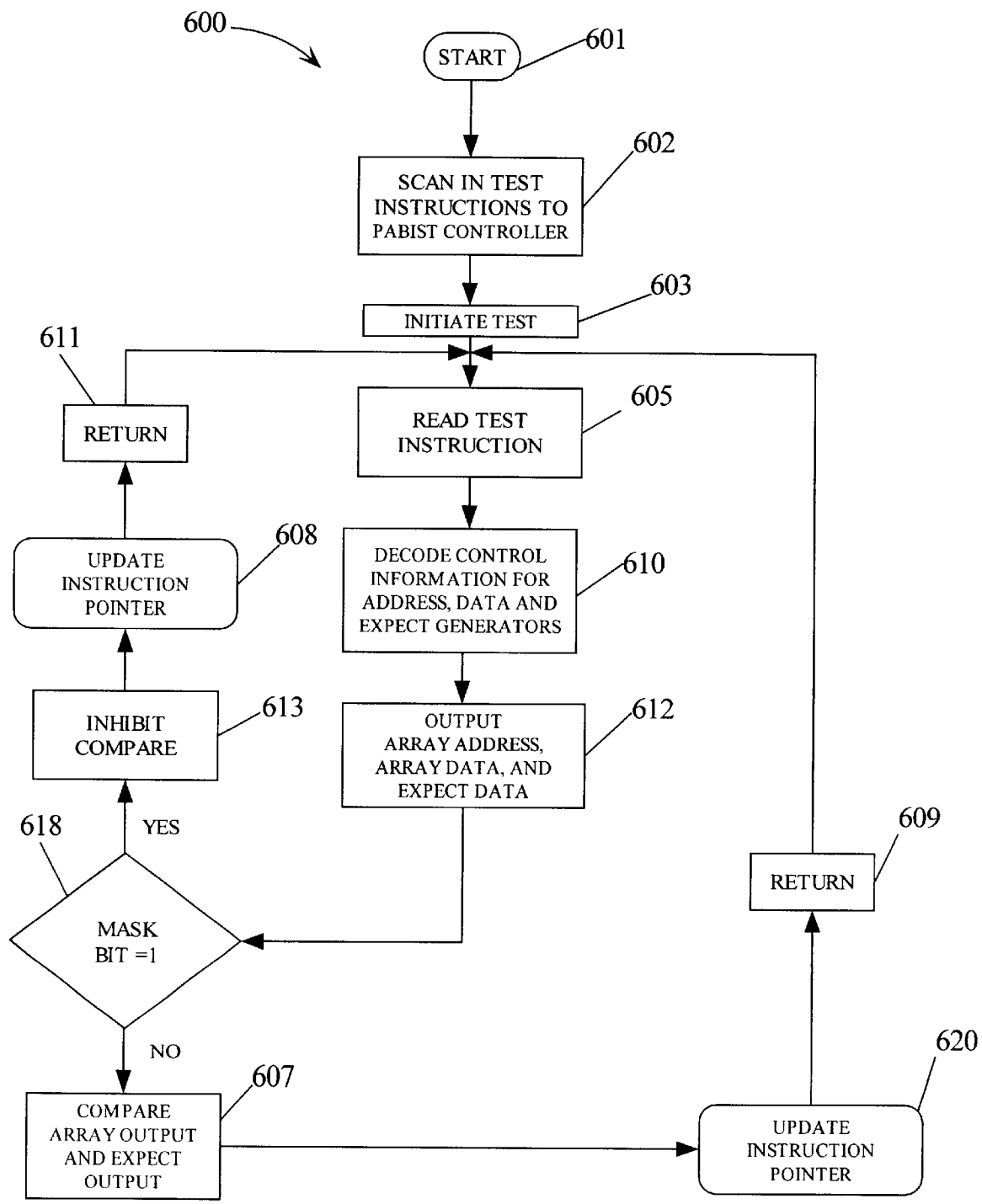
FIG. 6 is a flow diagram illustrating a method of the present invention.

FIG. 6 is a flow diagram illustrating the PABIST method 600 of the present invention. Exemplary devices referred to in the explanation the method 600 illustrated in FIG. 6 are found in FIG. 5 and FIG. 3. The process begins in step 601. In step 602, instructions are scanned into an exemplary microcode array 503 of PABIST controller 317. A test is initiated in step 603 with a test instruction read in step 605 and decoded in step 610 to generate control bits for controlling exemplary finite state machine controller 504, programmable address generator 307, programmable data generator 306, and programmable expect generator 305, mask bit 314 and read/write control 318 In step 612, the various generators generate in response to the controls, array addresses, array data, read/write, expect data and a mask bit. In step 618, if an operation is done with no mask bit, the array output data is compared to the expect generator output in step 607, the results are stored in exemplary data compare register 313 and the instruction counter is updated in step 620 followed by a return 609 to a new test instruction read in step 605. If there is a mask bit present in step 618, the compare (array output and expect output) is inhibited in step 613 and the instruction is updated in step 608 and a return is issued in step 611 to read a new test instruction in step 605.

Figure 7:
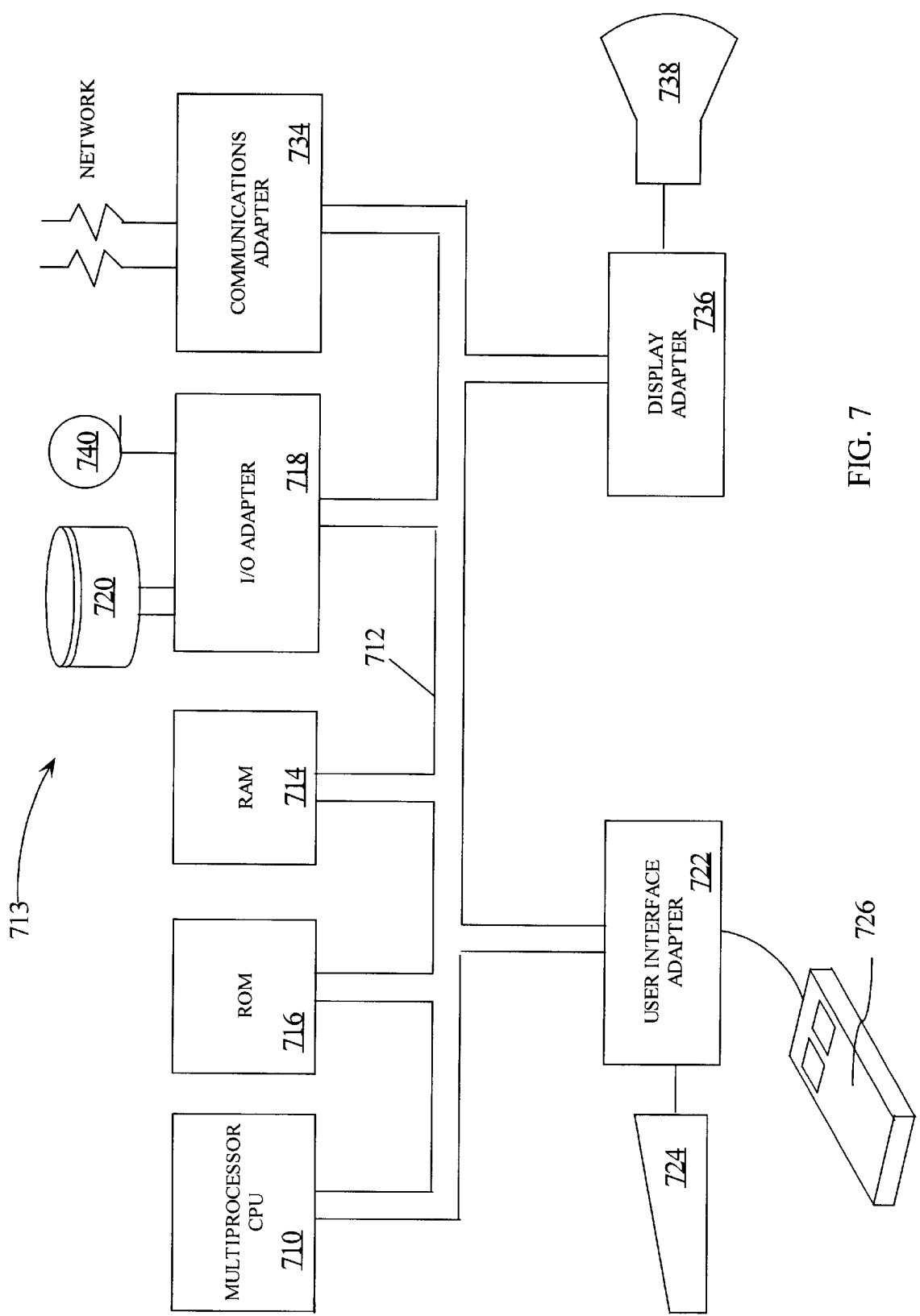
FIG. 7 is a block diagram illustrating a data processing system for use with the present invention.

A representative hardware environment for practicing the present invention is depicted in FIG. 7, which illustrates a typical hardware configuration of data processing system 713 in accordance with the subject invention having central processing unit (CPU) 710, such as a conventional microprocessor, and a number of other units interconnected via system bus 712. Data processing system 713 includes random access memory (RAM) 714, read only memory (ROM) 716, and input/output (I/O) adapter 718 for connecting peripheral devices such as disk units 720 and tape drives 740 to bus 712, user interface adapter 722 for connecting keyboard 724, mouse 726, and/or other user interface devices such as a touch screen device (not shown) to bus 712, communication adapter 734 for connecting data processing system 713 to a data processing network, and display adapter 736 for connecting bus 712 to display device 738. CPU 710 may include other circuitry not shown herein, which will include circuitry commonly found within a microprocessor (e.g., execution unit, bus interface unit, arithmetic logic unit, etc.). CPU 710 may also reside on a single integrated circuit. System 713 and primarily CPU 710 may contain any number of PABIST systems as described herein.

Although the present invention and its advantages have been described in detail, it should be understood that various changes, substitutions and alterations can be made herein without departing from the spirit and scope of the invention as defined by the appended claims.

What is claimed is:

1. A programmable Array Built-In-Self-Test (ABIST) method for testing an array comprising the steps of:
   scanning into a programmable ABIST controller a test instruction sequence;
   executing said test instruction sequence;
   outputting, in response to executing each instruction step in said test instruction sequence, first control bits and second control bits and coupling said first control bits to a programmable expect generator and coupling said second control bits to an array input address generator and an array input data generator for said array;
   generating expect data outputs from said programmable expect generator in response to said first control bits concurrent with generating array input addresses from said array input address generator and array input data from said array input data generator in response to said second control bits;
   generating array outputs in response to said array input addresses and said array input data;
   comparing said expect data outputs, said array outputs, and selected control bits from said first control bits; and
   generating and outputting a sequence of pass/fail results in response to said comparison of said expect data outputs, said array outputs and said selected control bits.

2. The method of claim 1, wherein said programmable expect generator is substantially a duplicate of said array input data generator with corresponding like control functions.

3. The method of claim 1, wherein said selected control bits comprise a masking bit, said masking bit operable to inhibit or enable a data comparator performing said comparison step.

4. The method of claim 1, wherein said sequence of pass/fail results are outputted via a level sensitive scan device (LSSD).

5. The method of claim 1, wherein said array input data generator and said array input address generator are data control registers.

6. A programmable ABIST system (PABIST) operable for testing an integrated circuit array, comprising:
   a PABIST controller operable for generating array input address generator control bits, array input data generator control bits for an array input data generator, read/write control bits, and expect control bits in response to executing programmed instructions;
   a programmable expect generator (PEG), said PEG operable for receiving said expect control bits and generating corresponding expect output data in response to said expect control bits;
   a data comparator, said data comparator operable for comparing array output data from said integrated circuit array, said expect output data, and selected expect control bits of said expect control bits, said data comparator generating pass/fail results of said comparing of said array output data, said expect output data and said selected expect control bits; and
   a data register for storing and outputting results of testing said integrated circuit array.

7. The PABIST system of claim 6, wherein said PEG operates in a substantially similar manner as an array input data generator for generating array input data for said integrated circuit array.

8. The PABIST system of claim 6, wherein said selected expect control bits of said expect control bits include a masking bit, said masking bit operable to enable or inhibit said data comparator.

9. The PABIST system of claim 6, further comprising a data register coupled to said data comparator and operable for outputting said results via a level sensitive scan device (LSSD).

10. The PABIST system of claim 6, wherein said PABIST system further comprises:
   an array input address generator operable for generating array input addresses for said integrated circuit array in response to receipt of said input address generator control bits; and
   an array input data generator operable for generating array input data for said integrated circuit array in response to receipt of said input data generator control bits.

11. The PABIST system of claim 10, wherein said integrated circuit array is operable for outputting said array output data in response to receipt of said input addresses and said array input data.

12. The PABIST system of claim 10, wherein said array input address generator and said array input data generator are control registers.

13. A data processing system, comprising:

a central processing unit (CPU);

random access memory (RAM);

read only memory (ROM);

an I/O adapter; and a bus system coupling said CPU to said ROM, said RAM and said I/O adapter, wherein said CPU and said RAM further comprise arrays with programmable Array Built-In-Self-Test (PABIST), said PABIST comprising:
- a PABIST controller for generating array input addresses, array input data, read/write control bits, and expect control bits for an array under test in response to executing programmed instructions;
- a programmable expect generator (PEG), said PEG receiving said expect control bits and generating corresponding expect output data in response to said expect control bits; and
- a data comparator, said data comparator comparing array output data from said array under test, said expect output data, and selected expect control bits of said expect control bits, said data comparator generating pass/fail results of said comparing of said array output data, said expect output data and said selected expect control bits.

14. The data processing system of claim 13, wherein said PEG operates in a substantially similar manner as an array input data generator for generating array input data for said array under test.

15. The data processing system of claim 13, wherein said selected bits of said expect control bits include a masking bit, said masking bit operable to enable or inhibit said data comparator.

16. The data processing system of claim 13, further comprising a data register coupled to said data comparator and operable for outputting said results via a level sensitive scan device (LSSD).

17. The data processing system of claim 13, wherein said PABIST further comprises:

an array input address generator operable for generating array input addresses for said array under test in response to receipt of said input address generator control bits; and an array input data generator operable for generating array input data for said array under test in response to receipt of said input data generator control bits.

18. The data processing system of claim 17, wherein said array under test is operable for outputting said array output data in response to receipt of said array input addresses and said array input data.

19. The data processing system of claim 17, wherein said array input address generator and said array input data generator are control registers.

* * * * *